United States Patent
Lavi

(10) Patent No.: US 6,339,540 B1
(45) Date of Patent: Jan. 15, 2002

(54) CONTENT-ADDRESSABLE MEMORY FOR VIRTUAL GROUND FLASH ARCHITECTURES

(75) Inventor: Yoav Lavi, Raanana (IL)

(73) Assignee: Tower Semiconductor Ltd., Migdal Haemek (IL)

(*) Notice: Subject to any disclaimer, the term of this patent is extended or adjusted under 35 U.S.C. 154(b) by 0 days.

(21) Appl. No.: 09/730,611

(22) Filed: Dec. 5, 2000

(51) Int. Cl.$^7$ .............................................. G11C 15/00
(52) U.S. Cl. ................. 365/49; 365/185.08; 365/189.07
(58) Field of Search ............................ 365/49, 185.08, 365/185.16, 189.07, 185.01, 189.01

(56) References Cited

U.S. PATENT DOCUMENTS

| | | | |
|---|---|---|---|
| 5,808,929 A | 9/1998 | Sheikholeslami et al. ...... | 365/49 |
| 5,917,743 A | 6/1999 | Roy .............................. | 365/49 |
| 6,166,938 A | * 12/2000 | Wong ........................... | 365/49 |
| 6,256,216 B1 | * 7/2001 | Lien et al. ..................... | 365/49 |

* cited by examiner

Primary Examiner—Hoai V. Ho

(74) Attorney, Agent, or Firm—E. Eric Hoffman; Law Offices of Bever, Hoffman & Harms, LLP

(57) ABSTRACT

Five architectures for the implementation of virtual ground non-volatile content-addressable memory are provided. Three of the architectures are applicable to 2-bit non-volatile memory transistors having separate programming capability for two current directions (i.e., drain-to-source and source-to-drain. Another architecture is applicable to any floating gate memory transistor, including 1-bit and 2-bit non-volatile memory transistors. In general, an array of non-volatile memory transistors is arranged in a plurality of horizontal rows and vertical columns. Words are stored in selected columns of the array. Horizontal compare lines are coupled to receive a comparand word, with each compare line being coupled to the gates of the memory transistors in a row of the array. The vertically aligned source/drain regions of the memory transistors are coupled to form word lines. Sense amplifiers are coupled to selected word lines. Switches can be coupled to the sense amplifiers and/or word lines, thereby enabling program and compare operations to be performed in two different directions when 2-bit non-volatile memory transistors are used. Compare operations can be performed over two or more phases when 2-bit non-volatile memory transistors are used. Sequential logic circuits can also be coupled to the sense amplifiers, and used to store the results of different compare phases.

32 Claims, 9 Drawing Sheets

| WORD | WL | | | | BIT | | | | DEVICE CONDUCTING? | | | | | |
|---|---|---|---|---|---|---|---|---|---|---|---|---|---|---|
| | PHASE | SENSE | Vr | BIAS | 0 | 1 | 2 | J | 0J | 1J | 2J | 3J | 4J | 5J |
| 1 | 1 | 0 | 1 | L | 0 | 0 | 0 | 0 | Y | N | Y | N | Y | N |
| 2 | 1 | 2 | 1 | R | 0 | 0 | 1 | 1 | Y | N | Y | N | N | Y |
| 3 | 1 | 3 | 4 | L | 0 | 1 | 0 | 3 | Y | N | N | Y | Y | N |
| 4 | 1 | 5 | 4 | R | 0 | 1 | 1 | 4 | Y | Y | N | Y | N | Y |
| 5 | 1 | 6 | 7 | L | 1 | 0 | 0 | 6 | N | Y | Y | N | Y | N |
| 6 | 1 | 8 | 7 | R | 1 | 0 | 1 | 7 | N | Y | Y | Y | N | Y |
| 7 | 2 | 1 | 2 | L | 1 | 1 | 0 | 1 | N | Y | N | N | Y | N |
| 8 | 2 | 3 | 2 | R | 1 | 1 | 1 | 2 | N | N | Y | N | Y | Y |
| 9 | 2 | 4 | 5 | L | X | 0 | 0 | 4 | N | Y | N | N | Y | N |
| 10 | 2 | 6 | 5 | R | 1 | X | 0 | 5 | N | Y | Y | Y | N | N |
| 11 | 2 | 7 | 8 | L | 1 | 1 | X | 7 | N | N | Y | N | N | N |
| 12 | 2 | 9 | 8 | R | X | 0 | X | 8 | N | N | N | Y | N | N |
| 13 | 3 | 1 | 0 | L | 1 | 1 | X | 0 | N | Y | Y | N | Y | N |
| 14 | 3 | 2 | 3 | R | X | 0 | 0 | 2 | N | N | N | N | N | N |
| 15 | 3 | 4 | 3 | L | X | X | 1 | 3 | N | N | N | N | N | N |
| 16 | 3 | 5 | 6 | R | X | X | X | 5 | N | N | N | N | N | Y |
| 17 | 3 | 7 | 6 | L | 0 | X | X | 6 | Y | N | N | N | N | N |
| 18 | 3 | 8 | 9 | L | X | X | X | 8 | N | N | N | N | N | N |

FIG. 8

| WORD | PHASE | SENSE | Vr | BIAS | C00 | C0# | C1 | C1# | C2 | C2# | J | 0J | 1J | 2J | 3J | 4J | 5J | M? |
|---|---|---|---|---|---|---|---|---|---|---|---|---|---|---|---|---|---|---|
| 1 | 1 | 0 | 1 | L | 0 | 1 | 0 | 0 | 1 | 0 | 0 | Y | N | Y | N | Y | N | N |
| 2 | 1 | 2 | 1 | R | 0 | 1 | 0 | 0 | 1 | 0 | 1 | Y | N | Y | N | N | Y | Y |
| 3 | 1 | 3 | 4 | L | 0 | 1 | 0 | 0 | 1 | 0 | 3 | Y | N | N | Y | Y | N | N |
| 4 | 1 | 5 | 4 | R | 0 | 1 | 0 | 0 | 1 | 0 | 4 | Y | Y | Y | Y | N | Y | Y |
| 5 | 1 | 6 | 7 | L | 0 | 1 | 0 | 0 | 1 | 0 | 6 | N | Y | N | Y | Y | N | N |
| 6 | 1 | 8 | 7 | R | 0 | 1 | 0 | 0 | 1 | 0 | 7 | N | Y | Y | N | N | N | N |
| 7 | 2 | 1 | 2 | L | 0 | 1 | 0 | 0 | 1 | 0 | 1 | N | Y | Y | Y | Y | Y | N |
| 8 | 2 | 3 | 2 | R | 0 | 1 | 0 | 0 | 1 | 0 | 2 | N | N | N | N | N | N | N |
| 9 | 2 | 4 | 5 | L | 0 | 1 | 0 | 0 | 1 | 0 | 4 | N | Y | Y | Y | Y | N | N |
| 10 | 2 | 6 | 5 | R | 0 | 1 | 0 | 0 | 1 | 0 | 5 | N | Y | N | N | N | N | N |
| 11 | 2 | 7 | 8 | L | 0 | 1 | 0 | 0 | 1 | 0 | 7 | N | N | Y | Y | N | Y | Y |
| 12 | 2 | 9 | 8 | R | 0 | 1 | 0 | 0 | 1 | 0 | 8 | N | Y | N | Y | N | Y | Y |
| 13 | 3 | 1 | 0 | L | 0 | 1 | 0 | 0 | 1 | 0 | 0 | N | N | N | N | Y | N | N |
| 14 | 3 | 2 | 3 | R | 0 | 1 | 0 | 0 | 1 | 0 | 2 | N | Y | N | Y | N | N | Y |
| 15 | 3 | 4 | 3 | L | 0 | 1 | 0 | 0 | 1 | 0 | 3 | N | N | N | N | Y | N | N |
| 16 | 3 | 5 | 6 | R | 0 | 1 | 0 | 0 | 1 | 0 | 5 | N | N | N | N | N | Y | Y |
| 17 | 3 | 7 | 6 | L | 0 | 1 | 0 | 0 | 1 | 0 | 6 | Y | N | N | N | N | N | Y |
| 18 | 3 | 8 | 9 | L | 0 | 1 | 0 | 0 | 1 | 0 | 8 | N | N | N | N | N | N | Y |

FIG. 10

CONTENT-ADDRESSABLE MEMORY FOR VIRTUAL GROUND FLASH ARCHITECTURES

BACKGROUND OF THE INVENTION

1. Field of the Invention

The present invention relates to a non-volatile content-addressable memory (NVCAM) array implemented using a virtual-ground flash memory architecture.

2. Description of Related Art

Content-addressable memory (CAM) arrays are used in various applications where a fast searching capability is needed. Non-volatile CAM (NVCAM) arrays form a sub-class within this family. One example of a NVCAM array is described in U.S. Pat. No. 5,808,929.

While it is relatively easy to implement a CAM structure for a conventional non-volatile memory array that implements a common-source configuration, the task becomes more complex for a non-volatile memory array that implements a virtual-ground configuration. For example, U.S. Pat. No. 5,917,743 requires eight transistors to form a CAM cell and, in addition, requires the fabrication of a special isolation device.

It would therefore be desirable to have a NVCAM structure having a virtual-ground configuration that overcomes the deficiencies of the prior art.

SUMMARY

An object of the present invention is to provide a dense NVCAM array that utilizes a virtual-ground architecture. A first embodiment of the present invention can utilize either 1-bit or 2-bit non-volatile memory transistors, and achieves three transistor/bit density with no speed compromise. A second embodiment of the present invention can utilize either 1-bit or 2-bit non-volatile memory transistors, and achieves 2 transistor/bit density, with a two times degradation is speed. Third and fourth embodiments of the present invention utilize 2-bit non-volatile memory transistors and yield 1.5 and 1 transistor/bit density, with two-times and three-times degradation in speed, respectively. A fifth embodiment utilizes 2-bit non-volatile memory transistors and yields three separate three transistor/bit density arrays.

The first embodiment includes a content addressable memory (CAM) array having an array of 1-bit or 2-bit non-volatile memory transistors arranged in a plurality of rows and columns. Each memory transistor has a gate, a first device terminal and a second device terminal. A plurality of horizontally aligned compare lines are configured to receive a comparand word, wherein each compare line is coupled to the gate of each memory transistor in a row of the array. Vertically aligned device terminals in the array are coupled to form a plurality of word lines.

Selected columns of memory transistors are configured to store words in the array. One column of memory transistors adjacent to each selected column of memory transistors is unused (blank). In the first embodiment, two memory transistors are used to represent each bit of information. Thus, one memory transistor stores the data bit, while a corresponding memory transistor stores the complement of the data bit.

Consequently, three columns of memory transistors are effectively used to store two columns of data, thereby making the overall efficiency of the NVCAM array equal to three transistors/bit.

A compare operation is performed as follows. The compare data values are applied to the compare lines. Two compare lines are used for each bit, with one compare line receiving the compare data bit, and the other compare line receiving the complement of the compare data bit. Each column of memory transistors has two associated word lines. One of these word lines is coupled to receive a voltage of about 0 Volts (virtual ground). The other one of these word lines is coupled to receive a read reference voltage (e.g., 2 Volts) through a current sensing amplifier. If no current flows through the sense amplifier, then a match exists for the associated word. No current will flow through the sense amplifier if and only if, for all of the transistors in the column, either the compare line is at a low state or the transistor is programmed (i.e., does not conduct).

The second embodiment is similar to the first embodiment; however, in the second embodiment, all of the columns of the NVCAM array are used to store data values. In the second embodiment, a comparison operation is divided into two consecutive compare phases. In the first compare phase, a first set of words (columns) is compared with the comparand word. During the second compare phase, a second set of words (columns) is compared with the comparand word. The first and second compare phases are implemented by changing the functionality of the sense amplifiers during the two compare phases. In the second embodiment, the overall efficiency of the NVCAM array is equal to two transistors/bit, with the comparison operation taking twice as long as the comparison operation of the first embodiment.

The third embodiment includes an array of 2-bit non-volatile memory transistors arranged in a plurality of rows and columns, wherein selected columns of memory transistors are configured to store words. Again, each column of memory transistors that is selected to store a word is bordered by one unused column of memory transistors. In the selected columns, the two bits of each memory transistor are used to store a bit and a complementary bit of a corresponding word.

A comparison operation in the third embodiment is performed over two phases. A plurality of compare lines are provided, wherein each of the compare lines is coupled to the gates of the memory transistors in a corresponding row of the array. The compare lines are coupled to receive a comparand word during the first compare phase and a complement of the comparand word during the second compare phase.

Switches are provided to enable the word lines/sense amplifiers to be biased in a first direction during the first compare phase, thereby accessing a first bit of the 2-bit memory transistors. These switches are controlled to bias the word lines/sense amplifiers in a second direction during the second compare phase, thereby accessing a second bit of the 2-bit memory transistors. Sequential logic elements can be coupled to the output terminals of the sense amplifiers to store the results of the first and second compare phases.

The fourth embodiment includes an array of 2-bit non-volatile memory transistors arranged in a plurality of rows and columns, wherein each column of memory transistors is configured to store two words. Within each column, two memory transistors are used to represent each bit of information for each of the two words. Thus, one memory transistor stores two data bits, while a corresponding memory transistor stores the complement of those two data bits. A plurality of compare lines are provided, wherein each of the compare lines is coupled to the gates of the memory transistors in a corresponding row of the array.

In the fourth embodiment, a compare operation is performed over three compare phases. The compare lines are coupled to receive a comparand word and the complement of the comparand word during each of the three compare phases.

Switches and sense amplifiers are provided to enable the word lines to be biased in a first manner during a first compare phase, in a second manner during a second compare phase, and in a third manner during a third compare phase. Sequential logic elements can be coupled to the sense amplifiers to store the results of the first, second and third compare phases.

The fifth embodiment is similar to the fourth embodiment. However, in the fifth embodiment, the results of the first, second and third compare phases are considered separately, thereby effectively providing for three separate NVCAM arrays within a larger array. Each compare operation in the fifth embodiment is performed during a single compare phase.

The present invention will be more fully understood in view of the following description and drawings.

BRIEF DESCRIPTION OF THE DRAWINGS

FIG. 8 is a table defining the contents of the NVCAM array of FIG. 7 in a particular instance.

FIG. 10 is a table defining the results of a compare operation performed using the NVCAM array of FIG. 7.

DETAILED DESCRIPTION OF THE PRESENT INVENTION

The present invention implements a flash array that is similar to conventional virtual-ground flash arrays. However, the use of vertical and horizontal conductors in the present invention is different than the use of such conductors in a conventional virtual-ground flash array. To avoid any confusion, the terms used in the present disclosure are defined herein, and the reader is advised to ignore any previous conceptions on the orientation of bit lines or word lines. "Compare lines" is a term used for horizontally oriented conductors, which connect the control gates of the rows of memory transistors during a compare operation. In the described embodiments, the compare lines are conductively doped polycrystalline silicon. The compare lines are configured to receive the comparand values to be compared with the contents of the array. As described in more detail below, a compare line may be used to carry both a compare bit and its complement. In some embodiments, separate compare lines are used to carry a compare bit and its complement. During a program operation, the compare lines are used as bit lines to carry a high programming voltage or a ground voltage, according to the data to be written to the array.

"Word lines" is a term used to describe the vertically oriented conductors, which couple the sources of one column of memory transistors to the drains of an adjacent column of memory transistors. Word lines are thereby coupled to memory transistors forming a full word (and sometimes two full words) stored in the array. In the described embodiments, the word lines are conductively doped diffusion regions in a semiconductor substrate.

In the present description, the term "non-volatile memory transistor" is used to refer to either a conventional 1-bit floating gate memory transistor or a 2-bit non-volatile memory transistor (which can be used as either a 1-bit memory transistor or a 2-bit memory transistor). The term "device terminal" will be used to refer to the drain or the source of a non-volatile memory transistor. The term "gate" will be used to refer to the gate electrode of a non-volatile memory transistor.

A two-bit non-volatile memory transistor will now be briefly described. Two-bit non-volatile memory transistors are described in more detail in commonly owned, co-pending U.S. patent application Ser. No. 09/243,976 [TSL-016], which is hereby incorporated by reference in its entirety.

Figure 1A:
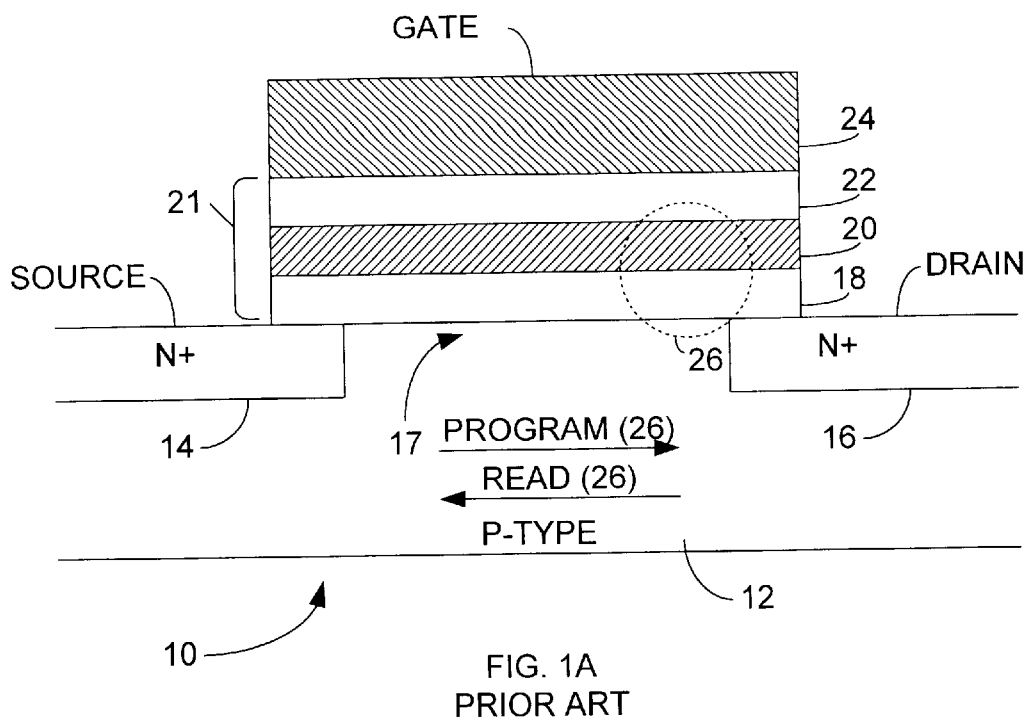
FIGS. 1A and 1B are cross sectional views of a conventional 2-bit non-volatile memory transistor that utilizes asymmetrical charge trapping.

FIG. 1A is a cross sectional view of a conventional 2-bit non-volatile memory transistor 10 that utilizes asymmetrical charge trapping. Two-bit memory transistor 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory transistor 10 operates as follows. A programming operation is performed by connecting source region 14 to ground, connecting drain region 16 to a programming voltage of about 8 Volts, and connecting control gate 24 to a voltage of about 10 Volts. Under these conditions, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within right charge trapping region 26 in nitride layer 20.

Memory transistor 10 is read by applying 0 Volts to the drain region 16, 2 Volts to the source region 14, and 3 volts to the gate electrode. If charge is stored in right charge trapping region 26 (i.e., the right charge trapping region 26 of memory transistor 10 is programmed), then memory transistor 10 does not conduct current under these conditions. If there is no charge stored in right charge trapping region 26 (i.e., the right charge trapping region of memory transistor 10 is erased), then memory transistor 10 conducts current under these conditions. The current, or lack of current, is sensed by a sense amplifier to determine the state of memory transistor 10.

Note that the polarity of the voltage applied across source region 14 and drain region 16 is reversed during the program and read operations. That is, the right charge trapping region 26 of memory transistor 10 is programmed in one direction (with source region 14 grounded), and read the opposite direction (with drain region 16 grounded). As a result, the read operation is referred to as a reverse read operation.

Figure 1B:
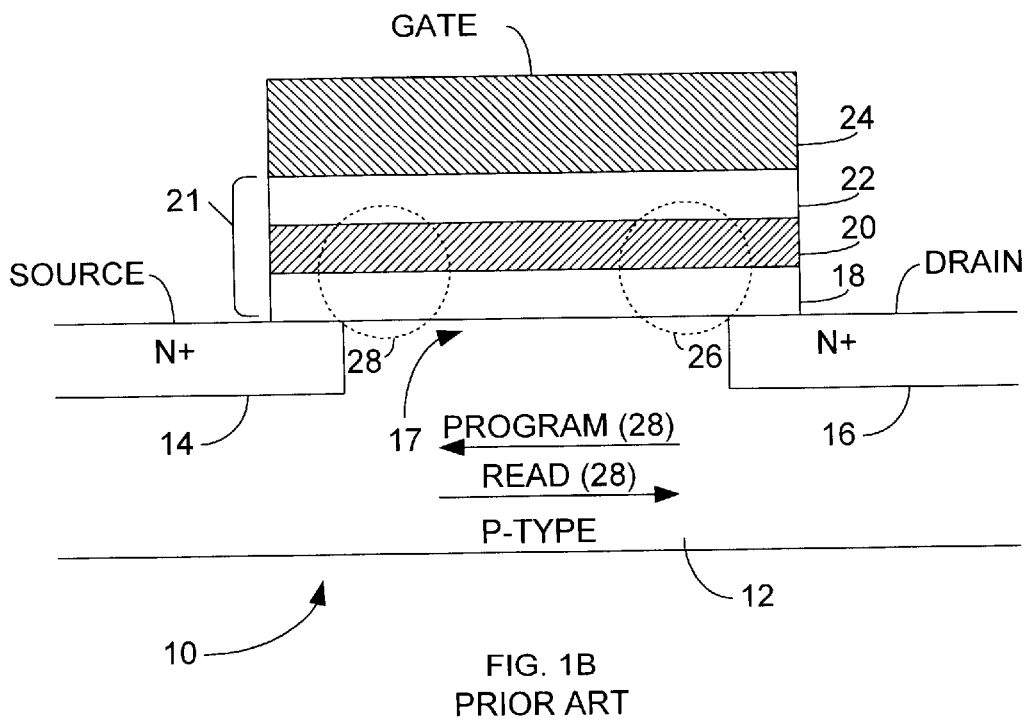

To operate memory transistor 10 as a 2-bit non-volatile semiconductor memory transistor, memory transistor 10 is controlled to use a second charge trapping region in nitride layer 20, which is located adjacent to source region 14. FIG. 1B illustrates both the right charge trapping region 26 (described above in connection with FIG. 1), and the left charge trapping region 28 in dashed lines. The left charge trapping region 28 is used to store a charge representative of a second bit. The left charge trapping region 28 is programmed and read in a manner similar to the right charge trapping region 26. More specifically, the left charge trapping region 28 is programmed and read by exchanging the source and drain voltages described above for programming and reading the right charge trapping region 26. Thus, the left charge trapping region 28 is programmed by applying 0 Volts to drain region 16, applying 8 Volts to source region 14 and applying 10 Volts to control gate 24. Similarly, the left charge trapping region 28 is read by applying 0 Volts to source region 14, 2 Volts to drain region 16, and 3 Volts to control gate 24.

Note that because nitride layer 20 is non-conductive, the charges stored in the right and left charge trapping regions 26 and 28 remain localized within nitride layer 20. Also note that the state of the right charge trapping region 26 does not interfere with the reading of the charge stored in the left charge trapping region 28 (and vice versa). Thus, if the right charge trapping region 26 is programmed (i.e., stores charge) and the left charge trapping region 28 is not programmed (i.e., does not store charge), then a reverse read of the right charge trapping region will not result in significant current flow. However, a reverse read of the left charge trapping region 28 will result in significant current flow because the high voltage applied to drain region 16 will result in unperturbed electronic transfer in the pinch off region adjacent to right charge trapping region 26. Thus, the information stored in the right and left charge trapping regions 26 and 28 is read properly.

Similarly, if both the right and left charge trapping regions are programmed, a read operation in either direction will result in no significant current flow. Finally, if neither the right charge trapping region 26 nor the left charge trapping region 28 is programmed, then read operations in both directions will result in significant current flow.

It is well known that the structure of a conventional 1-bit floating gate memory transistor is similar to the structure of memory transistor 10; however, the nitride layer 20 is replaced with a conductive material (e.g., conductively doped polycrystalline silicon). Charge stored in this conductive material is not localized, such that only one bit is stored in the floating gate memory transistor.

Figure 2:
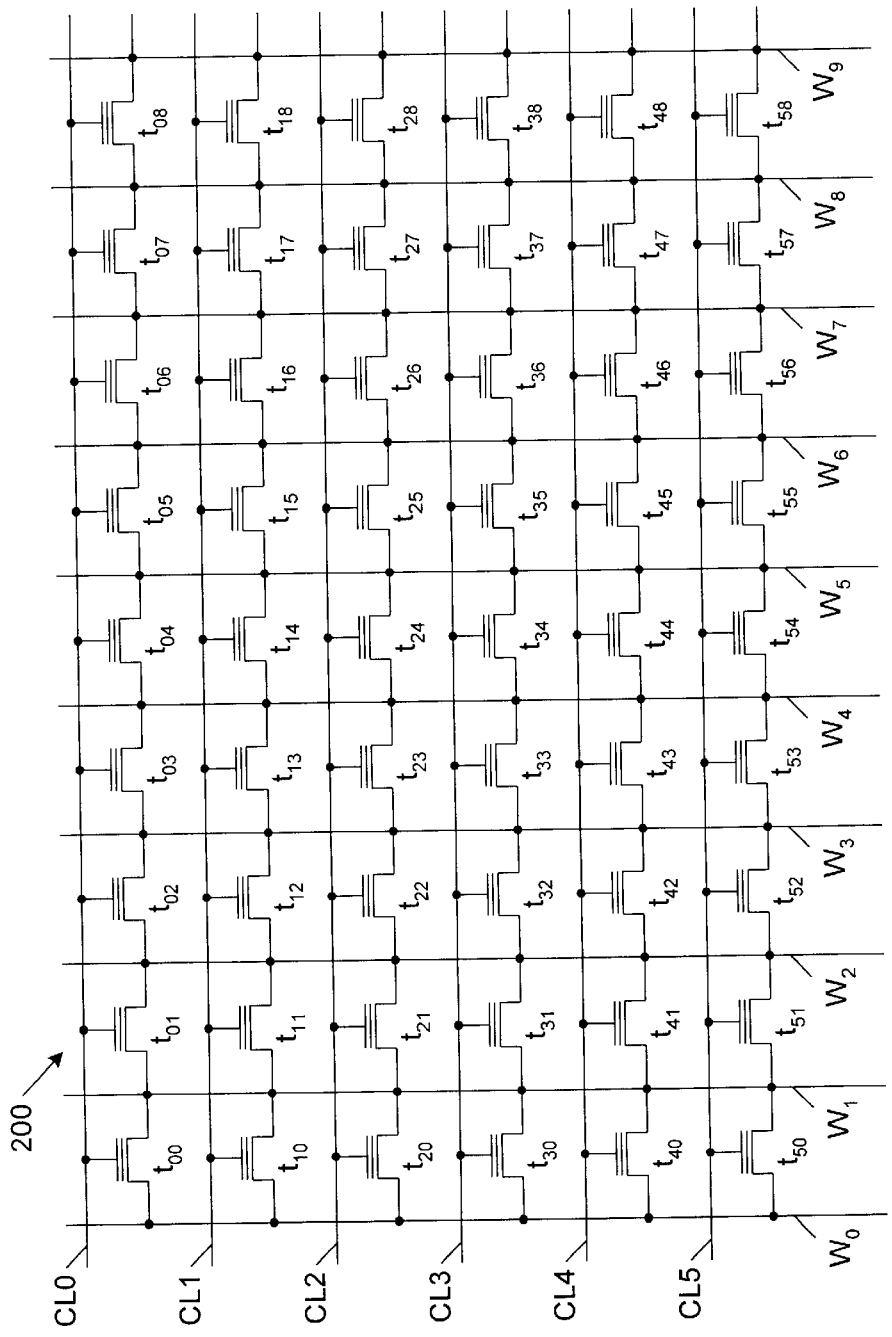
FIG. 2 is a circuit diagram of an array of non-volatile memory transistors that is used to describe several embodiments of the present invention.

FIG. 2 is a circuit diagram of an array 200 of non-volatile memory transistors $t_{00}$–$t_{58}$, which is used to describe several embodiments of the present invention. Array 200 includes 54 non-volatile memory transistors $t_{00}$–$t_{58}$ arranged in six rows and nine columns. In first and second embodiments of the present invention, the non-volatile memory transistors $t_{00}$–$t_{58}$ can be any type of floating gate transistor (including 1-bit or 2-bit non-volatile memory transistors). If 2-bit non-volatile memory transistors are used in the first or second embodiments, only one of the two bits available in each memory transistor is used. In third, fourth and fifth embodiments of the present invention, the non-volatile memory transistors $t_{00}$–$t_{58}$ are 2-bit non-volatile memory transistors. Array 200 includes ten word lines W0–W9 and six compare lines CL0–CL5. Array 200 is configured such that the gates of non-volatile memory transistors $t_{00}$–$t_{58}$ are connected to compare lines CL0–CL5, while the device terminals of non-volatile memory transistors $t_{00}$–$t_{58}$ are connected to word lines W0–W9. When array 200 is constructed with 2-bit non-volatile memory transistors, the methods and structures described in commonly owned, co-pending U.S. patent application Ser. No. 09/243,976 [TSL-016] can be used to form array 200. In such embodiments, compare lines CL0–CL5 are polysilicon (i.e., polycide), and word lines W0–W9 are conductive diffusion regions formed in a silicon substrate.

As described in more detail below, the number of word lines determines the number of words in array 200, while the number of compare lines determines the number of the bits in each word.

It is understood by those of ordinary skill in the art that the structure of FIG. 2 can be expanded to include additional word lines, compare lines and storage devices. It is further understood that the array of FIG. 2 may be too small for any practical application, and was selected only to provide clarity to the description of the invention. Array 200 is operated in the various ways described below to implement content addressable memory (CAM) arrays.

Figure 3:
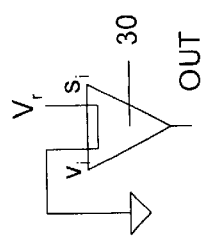
FIG. 3 is a symbolic representation of a conventional current sense amplifier, which is used in all described embodiments of the present invention.

Reference is now made to FIG. 3, which depicts a current sense amplifier 30, which is used in all described embodiments of the present invention. Sense amplifier 30 is a conventional current sensing amplifier that provides a logic low output signal (out) if no current is detected at the $s_i$ input terminal. Conversely, sense amplifier 30 provides a logic high output signal if current is detected at the $s_i$ input terminal. Sense amplifier 30 maintains the voltage at the $s_i$ input terminal approximately equal to the voltage of the $v_i$ input terminal. Sense amplifier 30 is known to those of ordinary skill in the art. Note that FIG. 3 is not an electrical diagram, but rather, a symbol. It is understood that in current sense amplifier 30, the $s_i$ and $v_i$ input terminals are not actually short circuited.

First Embodiment

The first embodiment of the present invention will now be described in detail, with reference to FIG. 4.

Figure 4:
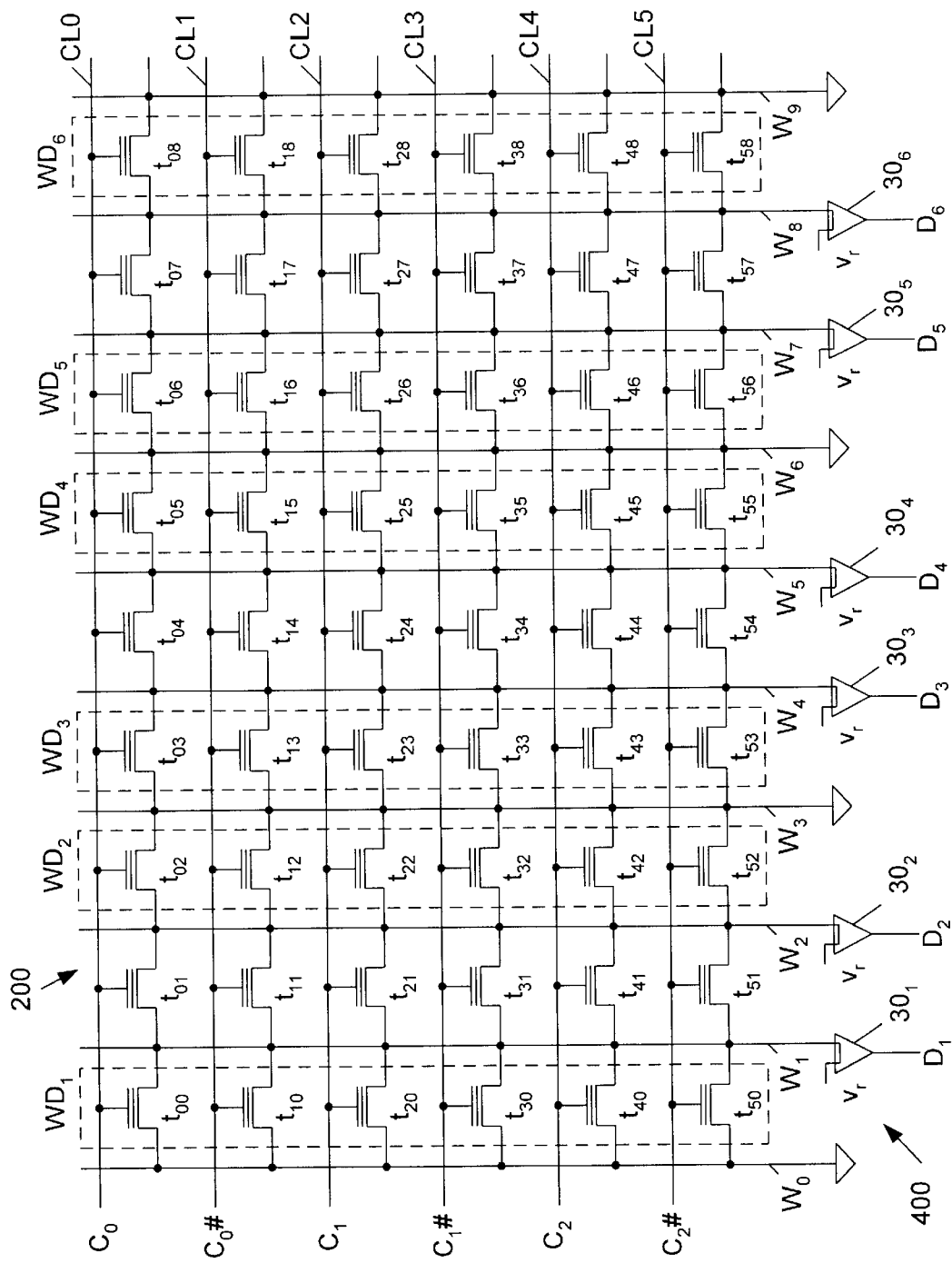
FIG. 4 is a circuit diagram of a non-volatile content addressable memory (NVCAM) in accordance with a first embodiment of the present invention.

FIG. 4 is a circuit diagram of a non-volatile content addressable memory (NVCAM) 400, which is implemented using array 200 (FIG. 2). Compare lines CL0–CL5 are coupled to receive compare bits C0-C0#, C1-C1# and C2-C2#, respectively. Word lines W0, W3, W6 and W9 are connected to receive a ground supply voltage (GND). Word lines W1, W2, W4, W5, W7 and W8 are coupled to the $s_i$ input terminals of sense amplifiers $30_1$–$30_6$, respectively. The $v_i$ input terminals of sense amplifiers $30_1$–$30_6$ are coupled to receive a reference voltage $v_r$ of about 2 Volts. Sense amplifiers $30_1$–$30_6$ provide output signals D1–D6, respectively.

In the first embodiment, the number of words in NVCAM array 400 is equal to the number of word lines minus one, times ⅔ (e.g., ⅔×(10−1)=6 words), and the number of bits per word is equal to ½ of the number of compare lines (e.g., 6×½=3 bits/word). Thus, NVCAM array 400 stores six 3-bit words. More specifically, non-volatile memory transistors $t_{00}$, $t_{10}$, $t_{20}$, $t_{30}$, $t_{40}$ and $t_{50}$ store a first 3-bit word, $WD_1$. Non-volatile memory transistors $t_{02}$, $t_{12}$, $t_{22}$, $t_{32}$, $t_{42}$ and $t_{52}$ store a second 3-bit word, $WD_2$. Non-volatile memory transistors $t_{03}, t_{13}, t_{23}, t_{33}, t_{43}$ and $t_{53}$ store a third 3-bit word, $WD_3$. Non-volatile memory transistors $t_{05}, t_{15}, t_{25}, t_{35}, t_{45}$, and $t_{55}$ store a fourth 3-bit word, $WD_4$. Non-volatile memory transistors $t_{06}, t_{16}, t_{26}, t_{36}, t_{46}$ and $t_{56}$ store a fifth 3-bit word, $WD_5$. Finally, non-volatile memory transistors $t_{08}, t_{18}, t_{28}, t_{38}, t_{48}$ and $t_{58}$ store a sixth 3-bit word, $WD_6$.

The memory transistors in the second, fifth and eighth columns of array 200 are not used to store data values in the first embodiment. More specifically, the device terminals of the memory transistors in the second, fifth and eighth columns are all coupled to an $s_i$ input terminal of one of sense amplifiers $30_1$–$30_6$. As a result, these device terminals are all held at the reference voltage $v_r$. Because there is no voltage difference between the device terminals of the memory transistors in the second, fifth and eighth columns, these memory transistors do not conduct. In one embodiment, the memory transistors in the second, fifth and eighth columns are programmed, thereby further prohibiting conduction in these memory transistors. The unused columns of the array are redundant. By studying the layout structure of virtual ground Flash arrays, it can be seen that removal of the redundant columns will add rather than save in area, so the redundant columns are not removed.

Table 1 below summarizes the connections for the six 3-bit words $WD_1$–$WD_6$ of NVCAM array 400.

TABLE 1

| Word | Source WL | Drain WL | Output |
|---|---|---|---|
| $WD_1$ | W0 | W1 | D1 |
| $WD_2$ | W3 | W2 | D2 |
| $WD_3$ | W3 | W4 | D3 |
| $WD_4$ | W6 | W5 | D4 |
| $WD_5$ | W6 | W7 | D5 |
| $WD_6$ | W9 | W8 | D6 |

The first 3-bit word $WD_1$ is stored as follows. Vertically-adjacent transistors $t_{00}$ and $t_{10}$ are used to store a first data bit and its complement, respectively. Similarly, vertically-adjacent transistors $t_{20}$ and $t_{30}$ are used to store a second data bit and its complement, respectively. Finally, vertically-adjacent transistors $t_{40}$ and $t_{50}$ are used to store a third data bit and its complement, respectively. The other 3-bit words $WD_2$–$WD_6$ are stored in a similar manner.

To store a value of "101" as word $WD_1$, transistor $t_{00}$ is programmed and transistor $t_{10}$ is erased; transistor $t_{20}$ is erased and transistor $t_{30}$ is programmed; and transistor $t_{40}$ is programmed and transistor $t_{50}$ is erased. A bit of a word can be given a "Don't Care" value by programming both of the transistors used to represent the bit. For example, to store a "Don't Care" value in the first bit of word $WD_1$, both of non-volatile memory transistors $t_{00}$ and $t_{10}$ are programmed. Negative logic is used in the described embodiments. Thus, erased memory transistors allow current to flow during a read operation, and programmed memory transistors prevent current flow during a read operation.

A 3-bit word to be compared (i.e., comparand word) is asserted on compare lines CL0–CL5 as comparand bit pairs C0-C0#, C1-C1# and C2-C2#. Thus, compare lines CL0, CL2 and CL4 are coupled to receive the three bits of the comparand word C0-C2, and compare lines CL1, CL3 and CL5 are coupled to receive the respective complementary bits C0#–C2#. For example, if the comparand word "100" is to be compared with the contents of array 200, the following signals, as defined by Table 2, will be asserted on compare lines CL0–CL5. Note that in the present disclosure, words are defined from least significant bit to most significant bit.

TABLE 2

| Compare Line | Signal |
|---|---|
| CL0 | High |
| CL1 | Low |
| CL2 | Low |
| CL3 | High |
| CL4 | Low |
| CL5 | High |

A bit of the comparand word can be given a "Don't Care" value by setting both of the signals of the comparand bit pair to logic low values. An applied "Don't Care" value will result in a match condition with the corresponding bits in array 200, regardless of the contents of array 200. For example, if the word "X0X" is to be compared with the contents of array 200, where "X" represents a "Don't Care" value, the following signals, as defined by Table 3, will be asserted on compare lines CL0–CL5.

TABLE 3

| Compare Line | Signal |
|---|---|
| CL0 | Low |
| CL1 | Low |
| CL2 | Low |
| CL3 | High |
| CL4 | Low |
| CL5 | Low |

In order for a non-volatile memory transistor in array 200 to be turned on (conducting), the gate of the memory transistor should be held at a logic high voltage, and the memory transistor should be in an erased state.

In order for a sense amplifier to provide a logic high output signal, one or more of the non-volatile memory transistors connected to the sense amplifier must be turned on. A sense amplifier providing a logic high output signal indicates a non-match condition. If this condition does not exist (i.e., none of the non-volatile memory transistors coupled to the sense amplifier is turned on), then the sense amplifier will provide a logic low output signal. A sense amplifier providing a logic low output signal indicates a match condition.

A match condition will exist for a particular word only if a logic low value is applied to the gate of each erased memory transistor associated with that word. Ignoring, for the moment, the "Don't Care" bits, this will only happen in two cases. First, the compare bit $C_N$ is at a logic high state, the complementary compare bit $C_N\#$ is at a logic low state (i.e., the compare bit is a logic "1" value), and the status of the two corresponding non-volatile memory transistors are programmed and erased, respectively (i.e., the stored bit is a logic "1" value). Second, the compare bit $C_N$ is at a logic low state, the complementary compare bit $C_N\#$ is at a logic high state (i.e., the compare bit is a logic "0" value), and the status of the two corresponding non-volatile memory transistors are erased and programmed, respectively (i.e., the stored bit is a logic "0" value).

Thus, a match condition will exist only if the compare bit is identical to the stored bit. A stored word will match a comparand word only if all of the bits in the stored word match the corresponding bits of the comparand word.

"Don't Care" bits, whether compared or stored, do not result in current flow through a corresponding sense amplifier. That is, when a comparand bit and it's complementary bit are both at logic low values, neither one of the corresponding memory transistors is turned on. Similarly, when the two memory transistors storing a bit are both programmed, neither one of these memory transistors will conduct, regardless of the voltages applied to the gates of these memory transistors. As a result, a match condition will occur as long as all of the other bits in the stored word match the corresponding bits of the comparand word.

Second Embodiment

A second embodiment of the present invention will now be described. Like the first embodiment, the second embodiment can use either conventional floating gate non-volatile memory transistors or 2-bit non-volatile memory transistors (with only one bit of the 2-bit non-volatile memory transistors being used).

Figure 5:
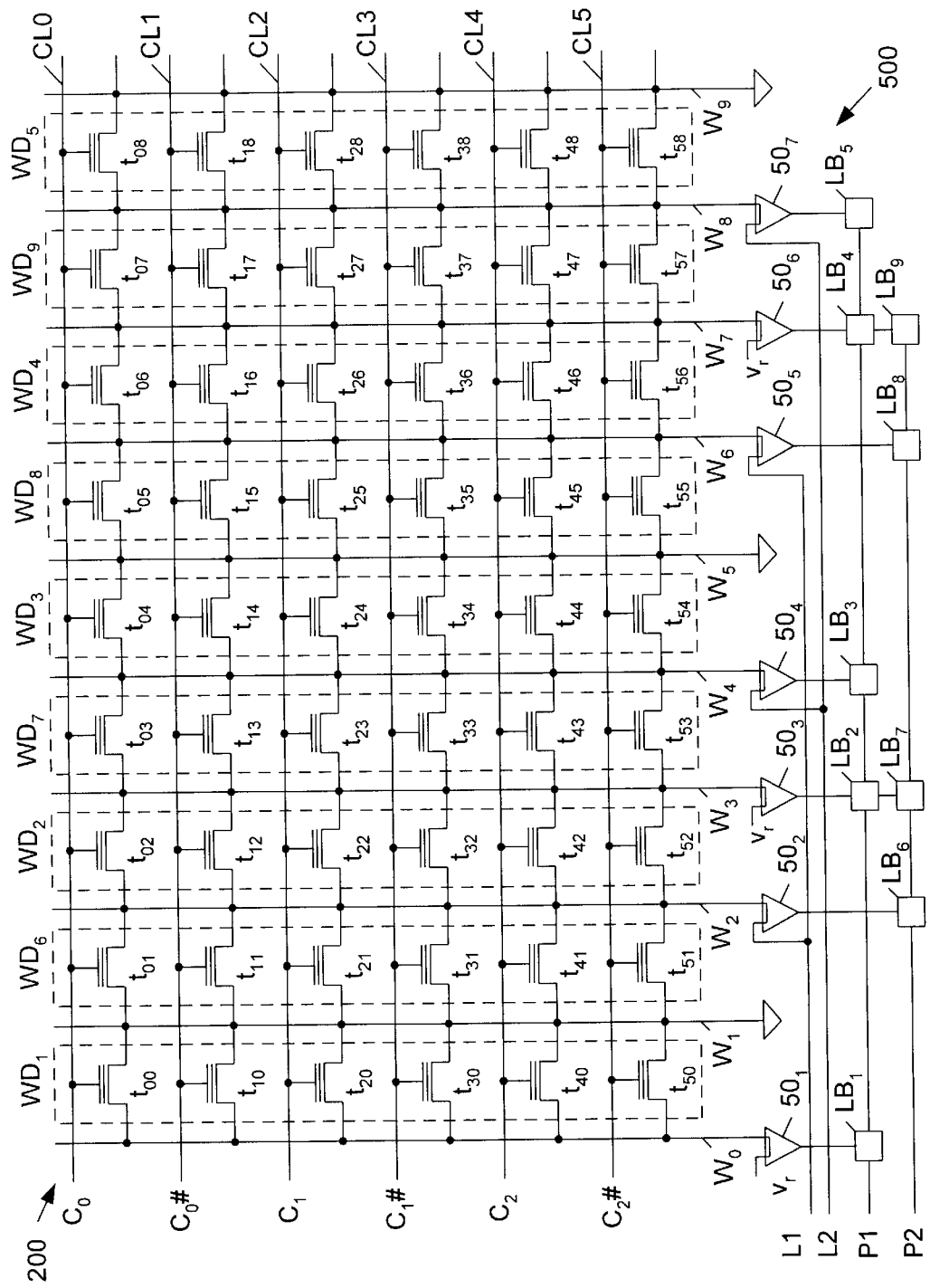
FIG. 5 is a circuit diagram of a NVCAM array in accordance with a second embodiment of the present invention.

FIG. 5 is a circuit diagram of a non-volatile content addressable memory (NVCAM) 500, which is implemented using array 200 (FIG. 2). Compare lines CL0–CL5 are coupled to receive compare bits C0-C0#, C1-C1# and C2-C2#, respectively. Word lines W1, W5 and W9 are connected to receive a ground supply voltage (GND). Word lines W0, W2, W3, W4, W6, W7 and W8 are coupled to the $s_i$ input terminals of sense amplifiers $50_1$–$50_7$, respectively. Sense amplifiers $50_1$–$50_7$ provide output signals to logic blocks $LB_1$–$LB_9$ as illustrated. Each of sense amplifiers $50_1$–$50_7$ is identical to sense amplifier 30 (FIG. 3). Each of logic blocks $LB_1$–$LB_9$ is a flip flop that latches data during first and second compare phases as described in more detail below.

In the second embodiment, the number of words in NVCAM array 500 is equal to the number of word lines minus one (e.g., (10−1)=9 words), and the number of bits per word is equal to ½ of the number of compare lines (e.g., 6×½=3 bits/word). Thus, NVCAM array 500 stores nine 3-bit words $WD_1$–$WD_9$. For example, non-volatile memory transistors $t_{00}$, $t_{10}$, $t_{20}$, $t_{30}$, $t_{40}$ and $t_{50}$ store a first 3-bit word, $WD_1$. Note that in the second embodiment, a 3-bit word is represented by six bits (i.e., three bits plus three complementary bits) in a manner similar to the first embodiment.

The memory transistors in all of the columns of array 200 are used to store data values in the second embodiment. As described in more detail below, a comparison operation is divided into two consecutive compare phases. In the first compare phase, a first set of words (i.e., $WD_1$–$WD_5$) is compared with the comparand word. During the second compare phase, a second set of words (i.e., $WD_6$–$WD_9$) is compared with the comparand word. The functions of word lines W0–W9 are changed in the two compare phases.

The configuration of compare lines CL0–CL5 is similar to that used in the first embodiment. That is, a pair of compare lines is connected to each stored bit and the complement of the stored bit. Lines L1 and L2 are connected to the $v_i$ input terminals of sense amplifiers $50_2$, $50_4$, $50_5$ and $50_7$ as illustrated.

Table 4 below illustrates the voltages applied to lines L1 and L2 during the two compare phases, as well as the resulting voltages applied to word lines W0–W9.

TABLE 4

| LINE | Phase 1 | Phase 2 |
|---|---|---|
| W0 | Vr (SENSE) | Vr |
| W1 | GND | GND |

TABLE 4-continued

| LINE | Phase 1 | Phase 2 |
|---|---|---|
| W2 | GND | Vr (SENSE) |
| W3 | Vr (SENSE) | Vr (SENSE) |
| W4 | Vr (SENSE) | GND |
| W5 | GND | GND |
| W6 | GND | Vr (SENSE) |
| W7 | Vr (SENSE) | Vr (SENSE) |
| W8 | Vr (SENSE) | GND |
| W9 | GND | GND |
| L1 | GND | Vr |
| L2 | Vr | GND |

Thus, during the first compare phase, the voltages applied to lines L1 and L2 configure sense amplifiers $50_1$, $50_3$, $50_4$, $50_6$ and $50_7$ to sense whether the comparand word on compare lines CL0–CL5 matches the contents of the first, third, fifth, seventh and ninth columns (i.e., words $WD_1$–$WD_5$) of array 200. The results of the first compare phase are latched into logic blocks $LB_1$–$LB_5$.

During the second compare phase, the voltages applied to lines L1 and L2 configure sense amplifiers $50_2$, $50_3$, $50_5$ and $50_6$ to sense whether the comparand word on compare lines CL0–CL5 matches the contents of the second, fourth, sixth and eighth columns (i.e., words $WD_6$–$WD_9$) of array 200. The results of the second compare phase are latched into logic blocks $LB_6$–$LB_9$. As described above, a logic high output signal provided by a sense amplifier identifies a non-match condition. Thus, the logic blocks storing a logic high signal indicate a non-match condition, and the logic blocks storing a logic low signal indicate a match condition.

In a variation of the second embodiment, array NVCAM array 500 can be used to implement two separate NVCAM arrays, each of which has a single phase compare operation, with the restriction that only one array can be compared at a time. The first NVCAM array is defined to include the first, third, fifth, seventh and ninth columns of array 200 (i.e., words $WD_1$–$WD_5$). The second NVCAM array is defined to include the second, fourth, sixth and eighty columns of array 200 (i.e., words $WD_6$–$WD_9$). In this variation, the two NVCAM arrays share compare lines CL0–CL5. A comparison operation to the first NVCAM array is identical to the first compare phase described above. Logic blocks $LB_1$–$LB_5$ store the results of a comparison operation in the first NVCAM array. Similarly, a comparison operation to the second NVCAM array is identical to the second compare phase described above. Logic blocks $LB_6$–$LB_9$ store the results of a comparison operation in the second NVCAM array.

Third Embodiment

A third embodiment of the present invention will now be described. It should be noted that the first and second embodiments can use either conventional floating gate non-volatile memory transistors or 2-bit non-volatile memory transistors (with only one bit of the 2-bit non-volatile memory transistors being used). In contrast, the third embodiment requires 2-bit non-volatile memory transistors, which include left and right charge trapping regions that can be independently programmed and read as described above in FIGS. 1A and 1B. It is one purpose of the third embodiment to utilize two bits per storage device, thereby multiplying the density of the resulting NVCAM array two-fold as compared to the first embodiment. In accordance with the third embodiment, array 200 is able to support six 6-bit words (as compared with six 3-bit words in the first embodiment).

Figure 6:
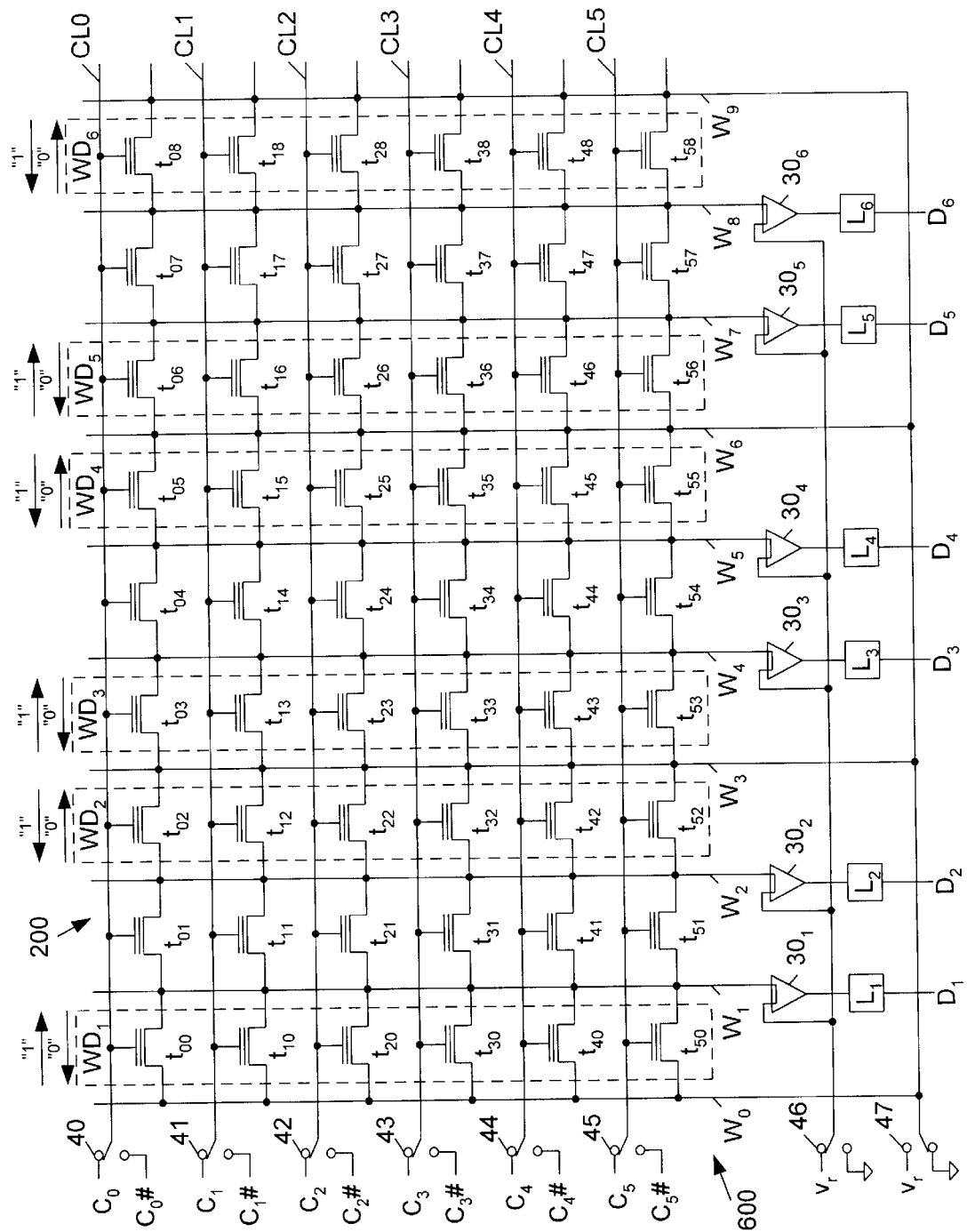
FIG. 6 is a circuit diagram of a NVCAM array in accordance with a third embodiment of the present invention.

FIG. 6 is a circuit diagram of a NVCAM array 600 in accordance with the third embodiment of the present invention. NVCAM array 600 is similar to NVCAM array 400 (FIG. 4). Thus, similar elements are labeled with similar reference numbers in FIGS. 4 and 6. In addition to the previously described elements of NVCAM array 400, NVCAM array 600 includes switches 40–47 and logic blocks $L_1$–$L_6$.

NVCAM array 600 is programmed in the following manner. In general, memory transistors in the first, fourth and seventh columns are programmed by programming current that flows in a first direction, and the third, sixth and eighth columns are programmed by programming current that flows in a second direction, opposite the first direction.

Thus, to program a logic "1" value in one of the memory transistors $t_{00}$, $t_{10}$, $t_{20}$, $t_{30}$, $t_{40}$, $t_{50}$ in the first column, the left charge trapping region of the transistor is programmed, while the right charge trapping region of the transistor is left in an erased state. Conversely, to program a logic "0" value in one of the memory transistors $t_{00}$, $t_{10}$, $t_{20}$, $t_{30}$, $t_{40}$, $t_{50}$ in the first column, the right charge trapping region of the transistor is programmed, while the left charge trapping region of the transistor is left in an erased state. To program a "Don't Care" value in any one of the memory transistors, both the left and right charge trapping regions are programmed. The memory transistors in the fourth and seventh columns are programmed using the same convention as the memory transistors in the first column.

To program a logic "1" value in one of the memory transistors $t_{02}$, $t_{12}$, $t_{22}$, $t_{32}$, $t_{42}$, $t_{52}$ in the third column, the right charge trapping region of the transistor is programmed, while the left charge trapping region of the transistor is left in an erased state. Conversely, to program a logic "0" value in one of the memory transistors $t_{02}$, $t_{12}$, $t_{22}$, $t_{32}$, $t_{42}$, $t_{52}$ in the third column, the left charge trapping region of the transistor is programmed, while the right charge trapping region of the transistor is left in an erased state. To program a "Don't Care" value in any one of the memory transistors, both the left and right charge trapping regions are programmed. The memory transistors in the sixth and eighth columns are programmed using the same convention as the memory transistors in the third column.

A comparison operation is performed as follows. Because both bits stored in a 2-bit non-volatile memory transistor cannot be read at the same time, a comparison operation is performed using two consecutive compare phases. During the first compare phase, the sense amplifiers $30_1$–$30_6$ are connected in a first direction, and the comparand word C0–C5 is applied to array 100. During the second compare phase P2, the sense amplifiers $30_1$–$30_6$ are connected in a second direction, and the complement of the comparand word (C0#–C5#) is applied to array 200.

A pair of arrows is located over each of the active columns of memory transistors. These arrows indicate the direction in which current flow is allowed during a read operation when logic "1" and logic "0" values are stored in the memory transistors of the column. Thus, when memory transistor $t_{00}$ stores a logic "1" value (i.e., the left charge trapping region of transistor $t_{00}$ is programmed and the right charge trapping region of transistor $t_{00}$ is erased) current is able to flow from left to right through transistor $t_{00}$ during a compare (read) operation. Conversely, when memory transistor $t_{00}$ stores a logic "0" value (i.e., the right charge trapping region of transistor $t_{00}$ is programmed and the left charge trapping region of transistor $t_{00}$ is erased) current is able to flow from right to left through transistor $t_{00}$ during a read (compare) operation.

During the first compare phase, switches 40–45 are controlled to enable a 6-bit comparand word C0–C5 to be applied to the compare lines CL0–CL5. Also during the first compare phase, switch 46 is controlled to connect sense amplifiers $30_1$–$30_6$ to receive the $v_r$ voltage, and switch 47 is controlled to connect word lines W0, W3, W6 and W9 to receive the ground voltage. Under these conditions, current will flow through sense amplifier $30_1$ only if the left charge trapping region of one of the memory transistors in the first column is erased (i.e., stores a logic "0" value), and the corresponding compare line has a logic high value (i.e., has a logic "1" value). That is, current will flow through sense amplifier $30_1$ only if a non-match condition exists. Sense amplifiers $30_3$ and $30_5$ operate in the same manner as sense amplifier $30_1$.

Also under these conditions, current will flow through sense amplifier $30_2$ only if the right charge trapping region of one of the memory transistors in the second column is erased (i.e., stores a logic "0" value), and the corresponding compare line has a logic high value (i.e., has a logic "1" value). That is, current will flow through sense amplifier $30_2$ only if a non-match condition exists. Sense amplifiers $30_4$ and $30_6$ operate in the same manner as sense amplifier $30_2$. The results of the first compare phase are stored in logic blocks $LB_1$–$LB_6$.

During the second compare phase, switches 40–45 are controlled to enable the complement of the comparand word C0–C5 (i.e., C0#–C5#) to be applied to the compare lines CL0–CL5. Also during the second compare phase, switch 46 is controlled to connect sense amplifiers $30_1$–$30_6$ to receive the ground voltage, and switch 47 is controlled to connect word lines W0, W3, W6 and W9 to receive the $v_r$ voltage. Under these conditions, current will flow through sense amplifier $30_1$ only if the right charge trapping region of one of the memory transistors in the first column is erased (i.e., stores a logic "1" value), and the corresponding compare line has a logic high value (i.e., has a logic "0" value). That is, current will flow through sense amplifier $30_1$ only if a non-match condition exists. Sense amplifiers $30_3$ and $30_5$ operate in the same manner as sense amplifier $30_1$.

Also under these conditions, current will flow through sense amplifier $30_2$ only if the left charge trapping region of one of the memory transistors in the second column is erased (i.e., stores a logic "1" value), and the corresponding compare line has a logic high value (i.e., has a logic "0" value). That is, current will flow through sense amplifier $30_2$ only if a non-match condition exists. Sense amplifiers $30_4$ and $30_6$ operate in the same manner as sense amplifier $30_2$. The results of the second compare phase are stored in logic blocks $LB_1$–$LB_6$.

Note that a "Don't Care" compare value can be applied to one of the compare lines by applying a logic "0" value to the compare line during both the first and second compare phases.

Logic blocks $L_1$–$L_6$ are simple sequential logic circuits that detect and store logic high output signals at the output terminals of sense amplifiers $30_1$–$30_6$, respectively, during the first and second compare phases. As described above, the presence of a logic high output signal identifies a non-match condition. Thus, if a logic block does not detect a logic high output signal from its corresponding sense amplifier, then that logic block asserts a logic low output signal, thereby indicating the presence of a match condition.

Fourth Embodiment

A fourth embodiment of the present invention will now be described. Like the third embodiment, the fourth embodiment requires 2-bit non-volatile memory transistors, which include left and right charge trapping regions that can be independently programmed and read as described above in FIGS. 1A and 1B. It is noted that because the memory transistors in the second, fifth and eighth columns are not used in the third embodiment, only ⅔ of the storage capacity of array 200 is utilized in the third embodiment. It is therefore a purpose of the fourth embodiment to fully utilize the capacity of array 200. As described in more detail below, this purpose is achieved by dividing each compare operation into three consecutive compare phases, during which three groups of stored words are compared. The functions of word lines W0–W9 are changed in each of the three phases.

In accordance with the fourth embodiment, array 200 is able to support eighteen 3-bit words. In general, these 3-bit words are located in array 200 as follows. A 3-bit word is represented by the six right charge trapping regions in each column of array 200. For example, a 3-bit word is represented by the right charge trapping regions of memory transistors $t_{00}$, $t_{10}$, $t_{20}$, $t_{30}$, $t_{40}$ and $t_{50}$. In addition, a 3-bit word is represented by the six left charge trapping regions in each column of array 200. For example, a 3-bit word is represented by the left charge trapping regions of memory transistors $t_{00}$, $t_{10}$, $t_{20}$, $t_{30}$, $t_{40}$ and $t_{50}$. Note that in the fourth embodiment, a 3-bit word is represented by six bits (i.e., three bits plus three complementary bits) in a manner similar to the first embodiment.

Figure 7:
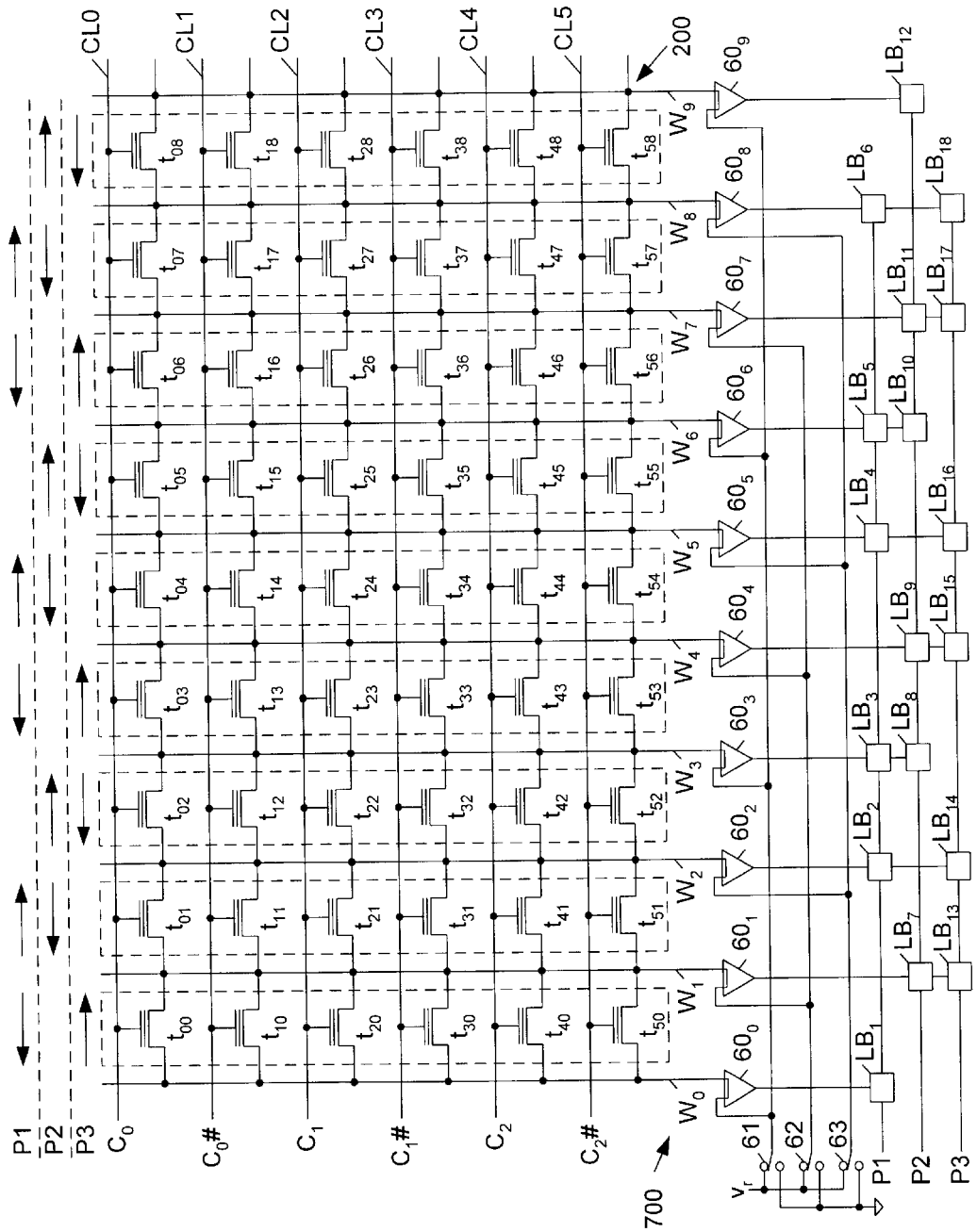
FIG. 7 is a circuit diagram of a NVCAM array in accordance with a fourth embodiment of the present invention.

FIG. 7 is a circuit diagram of a NVCAM array 700 in accordance with the fourth embodiment of the present invention. NVCAM array 700 includes array 200, sense amplifiers $60_0$–$60_9$, switches 61–63 and logic blocks $LB_1$–$LB_{18}$. Each of sense amplifiers $60_0$–$60_9$ is identical to sense amplifier 30 (FIG. 3). Each of logic blocks $LB_1$–$LB_{18}$ is a flip flop that latches data during the first, second and third compare phases as illustrated in FIG. 7.

The configuration of compare lines CL0–CL5 is similar to that used in the first embodiment. That is, a pair of compare lines is connected to each stored bit and the complement of the stored bit. The word lines W0–W9 can be forced to the ground voltage or the $V_r$ reference voltage by switches 61–63.

Table 5 below illustrates the configuration of switches 61–63 during the three compare phases, as well as the resulting voltages applied to word lines W0–W9.

TABLE 5

|  | Phase 1 | Phase 2 | Phase 3 |
| --- | --- | --- | --- |
| W0 | GND (SENSE) | GND | Vr |
| W1 | Vr | GND (SENSE) | GND (SENSE) |
| W2 | GND (SENSE) | Vr | GND (SENSE) |
| W3 | GND (SENSE) | GND (SENSE) | Vr |
| W4 | Vr | GND (SENSE) | GND (SENSE) |
| W5 | GND (SENSE) | Vr | GND (SENSE) |
| W6 | GND (SENSE) | GND (SENSE) | Vr |
| W7 | Vr | GND (SENSE) | GND (SENSE) |
| W8 | GND (SENSE) | Vr | GND (SENSE) |
| W9 | GND | GND (SENSE) | Vr |
| SWITCH 61 | GND | GND | Vr |
| SWITCH 62 | Vr | GND | GND |
| SWITCH 63 | GND | Vr | GND |

Thus, during the first compare phase, switches 61–63 configure sense amplifiers $60_0$, $60_3$ and $60_6$ to sense whether the comparand word on compare lines CL0–CL5 matches the contents of the left charge trapping regions of the memory transistors in the first, fourth and seventh columns of array 200. This configuration is identified at the top of FIG. 7, which illustrates three arrows pointing toward the left charge trapping regions of the memory transistors in the first, fourth and seventh columns in the first compare phase.

Also during the first compare phase, sense amplifiers $60_2$, $60_5$ and $60_8$ are configured to sense whether the comparand word on compare lines CL0–CL5 matches the contents of the right charge trapping regions of the memory transistors in the second, fifth and eighth columns of array 200. This configuration is identified at the top of FIG. 7, which illustrates three arrows pointing toward the right charge trapping regions of the memory transistors in the second, fifth and eighth columns in the first compare phase.

The results of the first compare phase are latched into logic blocks $LB_1$–$LB_6$.

During the second compare phase, switches 61–63 configure sense amplifiers $60_1$, $60_4$ and $60_7$ to sense whether the comparand word on compare lines CL0–CL5 matches the contents of the left charge trapping regions of the memory transistors in the second, fifth and eighth columns of array 200. This configuration is identified at the top of FIG. 7, which illustrates three arrows pointing toward the left charge trapping regions of the memory transistors in the second, fifth and eighth columns in the second compare phase.

Also during the second compare phase, sense amplifiers $60_3$, $60_6$ and $60_9$ are configured to sense whether the comparand word on compare lines CL0–CL5 matches the contents of the right charge trapping regions of the memory transistors in the third, sixth and ninth columns of array 200. This configuration is identified at the top of FIG. 7, which illustrates three arrows pointing toward the right charge trapping regions of the memory transistors in the third, sixth and ninth columns in the second compare phase.

The results of the second compare phase are latched into logic blocks $LB_7$–$LB_{12}$.

During the third compare phase, switches 61–63 configure sense amplifiers $60_2$, $60_5$ and $60_8$ to sense whether the comparand word on compare lines CL0–CL5 matches the contents of the left charge trapping regions of the memory transistors in the third, sixth and ninth columns of array 200. This configuration is identified at the top of FIG. 7, which illustrates three arrows pointing toward the left charge trapping regions of the memory transistors in the third, sixth and ninth columns in the third compare phase.

Also during the third compare phase, sense amplifiers $60_1$, $60_4$ and $60_7$ are configured to sense whether the comparand word on compare lines CL0–CL5 matches the contents of the right charge trapping regions of the memory transistors in the first, fourth and seventh columns of array 200. This configuration is identified at the top of FIG. 7, which illustrates three arrows pointing toward the right charge trapping regions of the memory transistors in the first, fourth and seventh columns in the third compare phase.

The results of the third compare phase are latched into logic blocks $LB_{13}$–$LB_{18}$. Logic blocks storing a logic low value identify matching values in NVCAM array 700, while logic blocks storing a logic high value identify non-matching values in NVCAM array 700.

Figure 9:
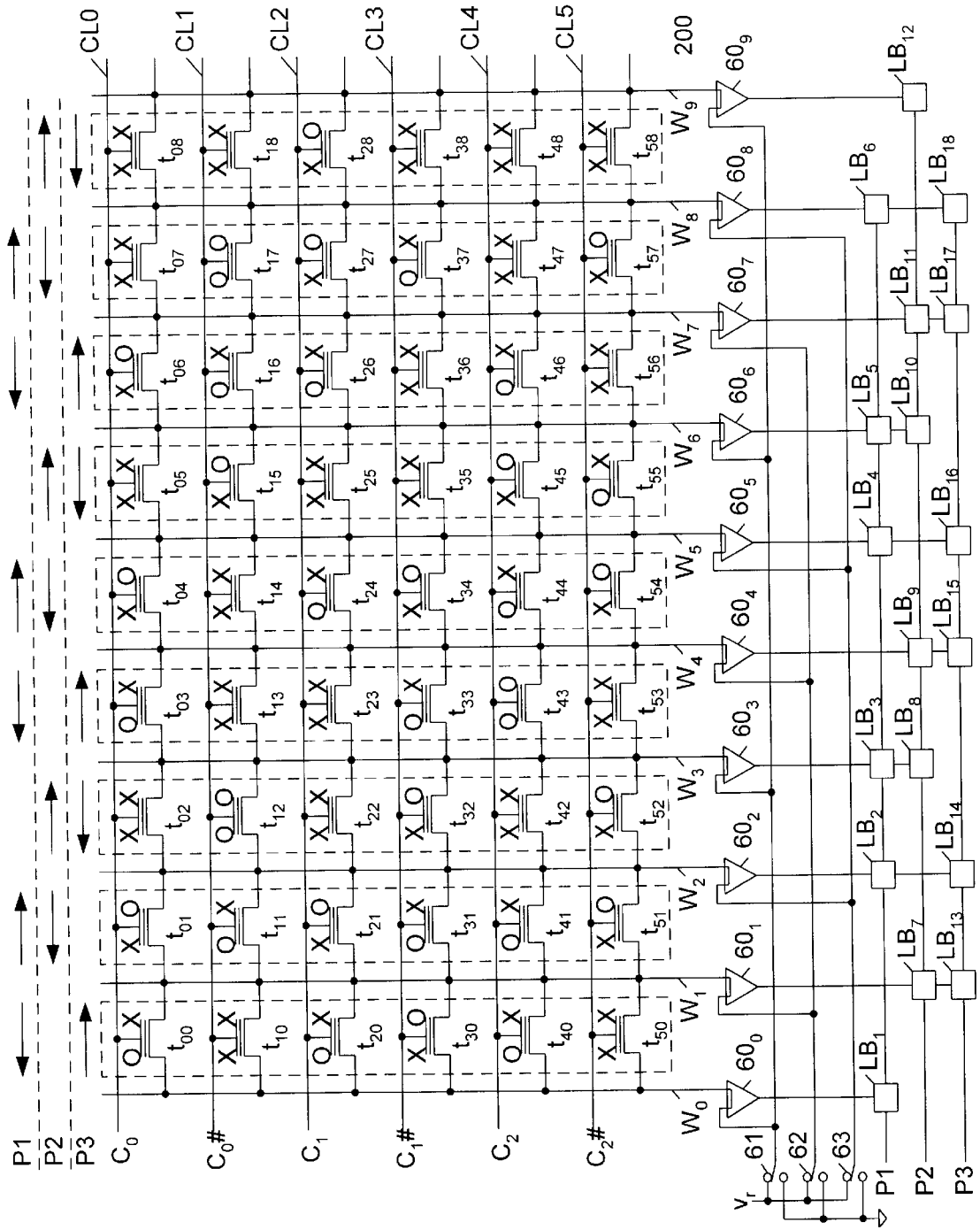
FIG. 9 is a circuit diagram of the NVCAM array of FIG. 7, illustrating the contents of the array as defined by FIG. 8.

A detailed example will now be given, to clarify the operation of the fourth embodiment. Memory transistors $t_{00}$–$t_{58}$ are generally designated as $t_{ij}$, where i is the row number and j is the column number in array 200. FIG. 8 is a table defining the contents of array 200 for a specific example of stored data. FIG. 9 is a diagram of NVCAM array 700 illustrating the contents of the array as defined by FIG. 8. In FIG. 9, the symbol "X" is placed adjacent to programmed charge trapping regions, and the symbol "O" is placed adjacent to erased charge trapping regions.

In FIG. 8, the BIT columns (i.e., BIT 0 to BIT 2) contain the data stored for each word in the present example. The BIAS column identifies the DC bias across the memory transistors being compared (i.e., L=left, R=right). The program/erase status of each charge trapping region is given by the i and j coordinates. An "N" indicates that the memory transistor will not conduct for the given bias, and a "Y" indicates that the memory transistor will conduct for the given bias.

Each memory transistor is referred to twice in FIG. 8, once for each charge trapping region. For example, memory transistor $t_{13}$ is referenced for Word 3 (i.e., BIAS=Left and conducting=No) and Word 15 (i.e., BIAS=Right and conducting=No). Thus, memory transistor $t_{13}$ is programmed not to conduct current in any direction. Memory transistor $t_{28}$ is referenced for Word 12 (i.e., BIAS=Right and conducting=Yes) and Word 18 (i.e., BIAS=Left and conducting=No). Thus, memory transistor $t_{28}$ will only conduct from left to right. Memory transistor $t_{17}$ is referenced for Word 6 (i.e., BIAS=Right and conducting=Yes) and Word 11 (i.e., BIAS=Left and conducting=Yes). Thus, memory transistor $t_{17}$ will conduct in both directions.

To compare a comparand word with the contents of NVCAM array 700, the comparand word is provided on compare lines CL0–CL5. More specifically, to provide logic "1" compare values at bit locations 0, 1 and 2, logic high values are applied to compare lines CL0, CL2 and CL4, respectively, and logic low values are applied to complementary compare lines CL1, CL3 and CL5, respectively. Similarly, to provide logic "0" compare values at bit locations 0, 1 and 2, logic low values are applied to compare lines CL0, CL2 and CL4, respectively, and logic high values are applied to complementary compare lines CL1, CL3 and CL5, respectively. To provide "Don't Care" compare values at bit locations 0, 1 and 2, logic low values are applied to compare lines CL0, CL2 and CL4, respectively, and logic low values are applied to complementary compare lines CL1, CL3 and CL5, respectively.

As described below, a comparand word having the bits "0X1" (from least significant bit to most significant bit) is compared with the contents of NVCAM array 700 as defined by FIGS. 8 and 9. The results of the compare operation are summarized by FIG. 10. Because only the C0# and C2 signals have logic high values, only the memory transistors $t_{1j}$ and $t_{4j}$ (i.e., the memory transistors in the second and fifth rows) receive a gate voltage that would enable conduction. Memory transistors $t_{1j}$ and $t_{4j}$ will conduct during the three compare phases only if their program/erase states allow. To determine this, columns 1J and 4J of FIG. 10 are examined. A "Y" value in either one of these columns indicates a conducting memory transistor, which in turn indicates a no-match condition. A "N" value in both of these columns indicates that there are no conducting memory transistors, which in turn indicates a match condition. As indicated by the last column of FIG. 10, match conditions (M?=Y) exist for Words 2, 4, 12, 13, 16, 17 and 18 in the present example.

For example, during the first compare phase, the left charge trapping regions of memory transistors $t_{00}$, $t_{10}$, $t_{20}$, $t_{30}$, $t_{40}$ and $t_{50}$ (i.e., Word 1) are subject to a compare operation. Because only the C0# and C2 signals have logic high values, only transistors $t_{10}$ and $t_{40}$ have an effect on the compare operation. As defined above, the left charge trapping region of transistor $t_{10}$ is programmed. As a result, transistor $t_{10}$ does not conduct during the compare operation. As also defined above, the left charge trapping region of transistor $t_{40}$ is erased. As a result, transistor $t_{40}$ conducts during the compare operation. Sense amplifier $60_0$ detects this current flow, and in response, provides a logic high signal to logic block $LB_1$. This logic high signal is interpreted as a non-match condition for Word 1.

Also during the first compare phase, the left charge trapping regions of memory transistors $t_{01}$, $t_{11}$, $t_{21}$, $t_{31}$, $t_{41}$ and $t_{51}$ (i.e., Word 2) are subject to a compare operation. Because only the C0# and C2 signals have logic high values, only transistors $t_{11}$ and $t_{41}$ have an effect on the compare operation. As defined above, the right charge trapping region of transistor $t_{11}$ is programmed. As a result, transistor $t_{11}$ does not conduct during the compare operation. As also defined above, the right charge trapping region of transistor $t_{41}$ is programmed. As a result, transistor $t_{41}$ does not conduct during the compare operation. Sense amplifier $60_2$ detects the lack of current flow, and in response, provides a logic low signal to logic block $LB_2$. This logic low signal is interpreted as a match condition for Word 2. The comparison operations for Words 3–18 are carried out in the same manner as the comparison operations described above for Words 1 and 2. The comparison results for Words 1–6 are latched into logic blocks $LB_1$–$LB_6$, respectively, during the first compare phase. The comparison results for Words 7–12 are latched into logic blocks $LB_7$–$LB_{12}$, respectively, during the second compare phase. Finally, the comparison results for Words 13–18 are latched into logic blocks $LB_{13}$–$LB_{18}$, respectively, during the third compare phase.

Fifth Embodiment

A fifth embodiment of the present invention will now be described, again with reference to FIG. 7. The implementation of the fifth embodiment is very similar to the implementation of the fourth embodiment. The operation of the fifth embodiment is therefore described by pointing out the differences between the fifth embodiment and the fourth embodiment.

The purpose of the fifth embodiment is to allow the implementation of three separate NVCAM arrays, each of which has a single phase compare operation, with the restriction that only one array can be compared at a time. Thus, the first NVCAM array is defined to include the charge trapping regions accessed during the first compare phase of the fourth embodiment. The second NVCAM array is defined to include the charge trapping regions accessed during the second compare phase of the fourth embodiment. Finally, the third NVCAM array is defined to include the charge trapping regions accessed during the third compare phase of the fourth embodiment. Together, the three NVCAM arrays utilize all of the 2-bit non-volatile memory transistors in array 200.

In the fifth embodiment, the two-pole switches 61–63 change connections according to the CAM array being accessed, rather than according to the compare phase number. In addition, in the fifth embodiment, the three rows of logic blocks $LB_1$–$LB_6$, $LB_7$–$LB_{12}$ and $LB_{13}$–$LB_{18}$ latch match information corresponding to the first, second and third NVCAM arrays, respectively.

In the described embodiment, the three NVCAM arrays share compare lines CL0–CL5, and have three separate 6-bit output buses. Each NVCAM array is therefore a 6 word×3 bit array. For the more general case of three completely separate NVCAM arrays having three separate sets of compare lines, it is trivial to add multiplexers to form the shared compare line structure used by the fifth embodiment.

Program and Erase

Referring now to FIG. 2, programming is performed on a column-by-column basis. For example, in order for the right charge trapping regions of the memory transistors connected between word lines W3 and W4 to be programmed, word lines W0 to W3 are connected to ground, and word lines W4 to W9 are connected to a high voltage (e.g., 8 Volts). The gates of the memory transistors which are to be programmed in the column are held at high voltage (e.g., 10 Volts). This operation is repeated to program the other columns. To program the left charge trapping regions in a column of memory transistors, a similar procedure is used, with all of the word lines to the right of the programmed column receiving the ground voltage, and all of the word lines to the left of the programmed column receiving the high voltage. For floating gate memory transistors, only one direction of programming is needed.

When the right charge trapping regions of the memory transistors in column N are programmed, programmed storage devices at columns M>N are prone to some amount of erase-disturb if their gates are held at 0 Volts. The condition of 0 Volts at the gate and a high voltage at the device terminals can cause tunneling of programming electrons. However, the duration of an erase operation is usually several orders of magnitude greater than the duration of a program operation, so that this problem is negligible, except for in very large arrays, which might need to be partitioned.

The entire array 200 can be erased at the same time. Alternately, array 200 can be erased by complete rows. During the erase operation, ground or a negative voltage is applied to the gates of the storage devices to be erased, and a high voltage (typically 10 V) is applied to all the word lines. This condition is maintained for a relatively long time (typically 1 second), until the programming electrons are removed from the floating gates/charge trapping regions.

Additional circuitry is required to perform the program and erase operations. One example of this circuitry is described in commonly owned, co-pending U.S. patent application Ser. No. 09/243,976 [TSL-016].

Program and erase verify operations can be done easily, because each memory transistor in each direction can be read separately, thanks to the orthogonal row and column addressing capability. For example, to verify that the left charge trapping region of memory transistor $t_{43}$ has been erased, the following steps are performed.

First, compare line CL4 is held at a logic high voltage. As explained below, this logic high voltage is selected to be slightly lower than the voltage normally applied to the gate of memory transistor $t_{43}$ during a read operation. Compare lines CL0–CL3 and CL5 are all held at the ground voltage.

The ground voltage is applied to word line W3, and the $v_r$ reference voltage is applied to word line W4. Word line W2 is held at 0 Volts, thereby avoiding disturb currents through memory transistor $t_{42}$. The output of a sense amplifier (not shown) coupled to word line W3 is checked for a no-match condition, which indicates that the left charge trapping region of memory transistor $t_{43}$ has been properly erased.

To verify that the left charge trapping region of memory transistor $t_{43}$ has been properly programmed, a similar procedure is followed, except that the voltage of compare line C4 is held at a logic high voltage that is higher than the voltage that is normally applied to the gate of transistor $t_{43}$ during a read operation. The output of the sense amplifier coupled to word line W3 is checked for a match condition, which indicates that the left charge trapping region of memory transistor $t_{43}$ has been properly programmed.

Note that program and erase verify operations are performed in a similar manner for the other charge trapping regions of array 200. In addition, the program and erase verify operations described above can be easily expanded to perform the verification of full rows of memory transistors in parallel. The voltage applied to the compare line during the verification operations is selected to be higher or lower than the voltage normally used for a read operation to guarantee the required margins for the long-term retention of data in the memory transistor.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A content addressable memory (CAM) array comprising:
    an array of non-volatile memory transistors arranged in a plurality of rows and columns, wherein each memory transistor has a gate, a first device terminal and a second device terminal, and wherein columns of memory transistors are configured to store words;
    a plurality of compare lines configured to receive a comparand word, wherein each compare line is coupled to the gate of each memory transistor in a row of the array;
    a first word line coupled to the first device terminal of each memory transistor in a first column of the array;
    a second word line coupled to the second device terminal of each memory transistor in the first column of the array, and to the first device terminal of each memory transistor in a second column of the array;
    a third word line coupled to the second device terminal of each memory transistor in the second column of the array;
    a first sense amplifier coupled to the first word line;
    a first supply voltage terminal coupled to the second word line; and
    a second sense amplifier coupled to the third word line.

2. The CAM of claim 1, wherein two memory transistors are configured to store each bit of a word.

3. The CAM of claim 1, further comprising a third column of the array located adjacent to the second column of the array, wherein the third column of the array is not configured to store a word.

4. The CAM of claim 3, wherein the third word line is coupled to the first device terminal of each memory transistor in the third column of the array.

5. The CAM of claim 4, further comprising:
    a fourth word line coupled to the second device terminal of each memory transistor in the third column of the array, and to the first device terminal of each memory transistor in a fourth column of the array, wherein the fourth column of memory transistors is configured to store a word;
    a third sense amplifier coupled to the fourth word line; and
    a fifth word line coupled to the second device terminal of each memory transistor in the fourth column of the array, wherein the fifth word line is coupled to the first supply voltage terminal.

6. The CAM of claim 4, wherein only two-thirds of the columns are configured to store words.

7. The CAM of claim 1, wherein the first voltage supply terminal is coupled to receive a voltage of about 0 Volts.

8. The CAM of claim 1, wherein the compare lines comprise polysilicon.

9. The CAM of claim 1, wherein the word lines comprise diffusion regions in a semiconductor substrate.

10. The CAM of claim 1, wherein the memory transistors are floating gate non-volatile memory transistors or 2-bit non-volatile memory transistors.

11. A content addressable memory (CAM) array comprising:
- an array of 2-bit non-volatile memory transistors arranged in a plurality of rows and columns, wherein each memory transistor has a gate, a first device terminal and a second device terminal, and wherein columns of memory transistors are configured to store words;
- a plurality of compare lines configured to receive a comparand word during a first compare phase and a complement of the comparand word during a second compare phase, wherein each compare line is coupled to the gate of each memory transistor in a row of the array;
- a first word line coupled to the first device terminal of each memory transistor in a first column of the array;
- a second word line coupled to the second device terminal of each memory transistor in the first column of the array, wherein the second word line is configured to receive a first control voltage during the first compare phase, and a second control voltage during the second compare phase; and
- a first sense amplifier coupled to the first word line, wherein the first sense amplifier is configured to receive the second control voltage during the first compare phase, and the first control voltage during the second compare phase.

12. The CAM of claim 11, further comprising a sequential logic element coupled to an output terminal of the sense amplifier, wherein the sequential logic element is configured to store output signals provided by the sense amplifier during the first compare phase and the second compare phase.

13. The CAM of claim 11, wherein the memory transistors in the first column are configured to store a first word, wherein each of the memory transistors in the first column is configured to store two bits of information that identifies a bit of the first word.

14. The CAM of claim 11, wherein the second word line is further coupled to the first device terminal of each memory transistor in a second column of the array, the CAM further comprising:
- a third word line coupled to the second device terminal of each memory transistor in the second column of the array; and
- a second sense amplifier coupled to the third word line, wherein the second sense amplifier is configured to receive the second control voltage during the first compare phase, and the first control voltage during the second compare phase.

15. The CAM of claim 11, wherein only two-thirds of the columns are configured to store words.

16. The CAM of claim 11, wherein the first control voltage is about 0 Volts, and the second control voltage is greater than 0 Volts.

17. The CAM of claim 11, wherein the compare lines comprise polysilicon.

18. The CAM of claim 11, wherein the word lines comprise diffusion regions in a semiconductor substrate.

19. A content addressable memory (CAM) array comprising:
- an array of 2-bit non-volatile memory transistors arranged in a plurality of rows and columns, wherein each memory transistor has a gate, a first device terminal and a second device terminal, and wherein columns of memory transistors are configured to store words;
- a plurality of compare lines configured to receive a comparand word during a first compare phase, a second compare phase and a third compare phase, wherein each compare line is coupled to the gate of each memory transistor in a row of the array;
- a first word line coupled to the first device terminal of each memory transistor in a first column of the array;
- a second word line coupled to the second device terminal of each memory transistor in the first column of the array and to the first device terminal of each memory transistor in a second column of the array;
- a third word line coupled to the second device terminal of each memory transistor in the second column of the array;
- a first sense amplifier coupled to the first word line;
- a second sense amplifier coupled to the second word line; and
- a third sense amplifier coupled to the third word line.

20. The CAM of claim 19, further comprising a set of switches for connecting the first sense amplifier and the third sense amplifier to a first control voltage, and the second sense amplifier to a second control voltage during the first compare phase.

21. The CAM of claim 20, wherein the set of switches is further configured for connecting the first sense amplifier and the second sense amplifier to the first control voltage, and the third sense amplifier to the second control voltage during the second compare phase.

22. The CAM of claim 21, wherein the set of switches is further configured for connecting the second sense amplifier and the third sense amplifier to the first control voltage, and the first sense amplifier to the second control voltage during the third compare phase.

23. The CAM of claim 19, further comprising sequential logic circuits coupled to output terminals of the first, second and third sense amplifiers, wherein each sequential logic circuit is activated during one of the first, second and third compare phases.

24. The CAM of claim 19, wherein the memory transistors in the first column are configured to store a first word and a second word.

25. The CAM of claim 19, wherein each of the columns is configured to store two words.

26. The CAM of claim 19, wherein the compare lines comprise polysilicon.

27. The CAM of claim 19, wherein the word lines comprise diffusion regions in a semiconductor substrate.

28. A content addressable memory system comprising:
- an array of non-volatile memory transistors arranged in rows and columns;
- a plurality of compare lines configured to receive compare data, each of the compare lines being coupled to gates of non-volatile memory transistors in a row of the array;
- a plurality of word lines, each being coupled to device terminals of non-volatile memory transistors in a column of the array;
- a first set of sense amplifiers coupled to a first set of the word lines, the first set of sense amplifiers being configured to compare data in every even column of the array during a first compare phase; and a second set of sense amplifier coupled to second set of the word lines, wherein the second set of sense amplifiers are configured to compare data in every odd column of the array during a second compare phase.

29. The content addressable memory system of claim 28, wherein one or more sense amplifiers are common to the first set of sense amplifiers and the second set of sense amplifiers.

30. The content addressable memory system of claim 28, wherein each of the non-volatile memory transistors stores one and only one value.

31. The content addressable memory system of claim 28, further comprising:

a first set of storage elements coupled to the first set of sense amplifiers, wherein the first set of storage elements store the results of the first compare phase; and a second set of storage elements coupled to the second set of sense amplifiers, wherein the second set of storage elements store the results of the second compare phase.

32. The content addressable memory system of claim 28, further comprising:

means for biasing a subset of the first set of sense amplifiers with a first control voltage during the first compare phase and a second control voltage during the second compare phase; and means for biasing a subset of the second set of sense amplifiers with the second control voltage during the first compare phase and the first control voltage during the second compare phase.

* * * * *